United States Patent
Choi et al.

(10) Patent No.: US 8,980,047 B2
(45) Date of Patent: Mar. 17, 2015

(54) MICROWAVE PLASMA PROCESSING APPARATUS

(75) Inventors: Jin Hyuk Choi, Suwon-si (KR); Sang Chul Han, Suwon-si (KR); Jong Il Kee, Osan-si (KR); Young dong Lee, Suwon-si (KR); Guen Suk Lee, Gangdong-gu (KR); Seung Hun Oh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 345 days.

(21) Appl. No.: 13/174,938

(22) Filed: Jul. 1, 2011

(65) Prior Publication Data

US 2012/0000610 A1 Jan. 5, 2012

(30) Foreign Application Priority Data

Jul. 2, 2010 (KR) .................. 10-2010-0063961
Jun. 14, 2011 (KR) .................. 10-2011-0057331

(51) Int. Cl.
C23C 16/00 (2006.01)
C23F 1/00 (2006.01)
H01L 21/306 (2006.01)
H01L 21/67 (2006.01)
H01J 37/32 (2006.01)

(52) U.S. Cl.
CPC ....... *H01L 21/67069* (2013.01); *H01J 37/3222* (2013.01)
USPC .............................. 156/345.41; 118/723 MW

(58) Field of Classification Search
USPC .............. 118/723 MW, 723 R, 723 ME; 156/345.36, 345.35, 345.41
See application file for complete search history.

(56) References Cited

U.S. PATENT DOCUMENTS

| 6,388,632 | B1 * | 5/2002 | Murakawa et al. ............ 343/770 |
| 7,270,713 | B2 * | 9/2007 | Blonigan et al. .............. 118/715 |
| 2002/0123200 | A1 * | 9/2002 | Yamamoto et al. ........... 438/345 |
| 2005/0005854 | A1 * | 1/2005 | Suzuki .................. 118/723 MW |
| 2009/0301656 | A1 * | 12/2009 | Nishimoto et al. ....... 156/345.41 |
| 2009/0317566 | A1 | 12/2009 | Nishimoto |

FOREIGN PATENT DOCUMENTS

| JP | 2002-324781 | * 11/2002 | .......... H01L 21/3065 |
| KR | 10-0673389 | 1/2007 | |
| KR | 10-0791660 | 12/2007 | |
| KR | 1020090131636 | 12/2009 | |

OTHER PUBLICATIONS

Machine English Translation JP2002324781, Goto et al dated Nov. 8, 2002.*

* cited by examiner

*Primary Examiner* — Rakesh Dhingra
(74) *Attorney, Agent, or Firm* — Harness, Dickey & Pierce, P.L.C.

(57) ABSTRACT

In accordance with example embodiments, a plasma processing apparatus includes a chamber configured to perform a plasma process, an upper plate on the chamber, an antenna under the upper plate and the antenna is configured to generate plasma in the chamber, an upper insulator between the upper plate and the antenna and the upper insulator covers a top of the antenna, a lower insulator covering a bottom of the antenna, an antenna support ring configured to fix the antenna to the upper plate, and a metal gasket adhered to the antenna support ring.

16 Claims, 6 Drawing Sheets

US 8,980,047 B2

MICROWAVE PLASMA PROCESSING APPARATUS

CROSS-REFERENCE TO RELATED APPLICATION(S)

This application claims priority under 35 U.S.C. §119 to the benefit of Korean Patent Application Nos. 2010-0063961 and 2011-0057331 filed on Jul. 2, 2010 and Jun. 14, 2011 in the Korean Intellectual Property Office, the entire disclosure of each of which is incorporated herein by reference.

BACKGROUND

1. Field

Example embodiments relate to a plasma processing apparatus.

2. Description of the Related Art

A plasma processing apparatus, for example a plasma processing apparatus that generates plasma using a microwave, may be used to form an insulating film on a semiconductor wafer and/or etch a film on a semiconductor wafer.

In some plasma processing apparatuses, electric current may be transmitted to an antenna in order to generate a plasma. An antenna may be provided between an upper plate and a lower ring and the lower ring may be pressed by a bolt. The antenna may be a conductor. During operation, when electric current is transmitted to an antenna, the antenna may generate heat due to the resistance of the conductor.

Due to thermal expansion effects, a circular antenna may expand in a radial direction when heated.

However, when a bolt passes through the antenna, the bolt may limit the antenna from being lengthened in the radial direction. Instead, the antenna can swell upward.

The top of the antenna may be supported by the clamping force of the bolt. The thermal expansion of the antenna may exert a force on the antenna.

Over time, heating may deform the antenna. Deformation of the antenna may have negative effects on the plasma process in which the antenna is used and may cause a slot in the antenna to arch.

In order to limit the antenna from heating, a thickness of an upper insulator may be reduced and the temperature of cooling water may be lowered. As a result, plasma generation efficiency may deteriorate and condensation may occur near the upper plate. An additional apparatus to prevent condensation may be required.

Thermal expansion may also oxidize the surface of the antenna. In order to limit oxidation on the antenna surface, the antenna may be plated with gold. However, the gold-plated layer can be detached.

SUMMARY

Example embodiments relate to a plasma processing apparatus, a main part for a plasma processing apparatus, and/or an antenna for a plasma processing apparatus.

Example embodiments relate to a plasma processing apparatus including a chamber configured to perform a plasma process, an upper plate on the chamber, an antenna under the upper plate and the antenna is configured to generate a plasma in the chamber, an upper insulator between the upper plate and the antenna and the upper insulator covers a top of the antenna, a lower insulator covering a bottom of the antenna, an antenna support ring configured to fix the antenna to the upper plate, and a metal gasket adhered to the antenna support ring.

The antenna may be a flat plate antenna.

The antenna may include a plurality of slots including a variety of shapes, the plurality of slots defined by at least one inner surface of the antenna.

The antenna may include a circumferential surface, and a plurality of grooves defined by the circumferential surface.

The antenna support ring may include a plurality of protrusions along a circumferential surface of the antenna support ring.

The plasma processing apparatus may include a metal gasket that is configured to push the antenna up to maintain contact between the antenna and the upper plate.

The metal gasket may be configured to maintain electrical contact between the antenna and the antenna support ring.

The chamber of the plasma processing apparatus may include a susceptor that is configured to support a semiconductor wafer. The susceptor may be connected to at least one of a heater to heat the semiconductor wafer and an electrode configured to apply RF bias.

Example embodiments relate to a main part for a plasma processing apparatus including a chamber, an antenna support ring on the chamber, an antenna on the antenna support ring, an insulator covering the antenna, and an upper plate on the insulator. The antenna is configured to generate a plasma in the chamber. The antenna support ring may be configured to fix the upper plate to the antenna.

The antenna may include a flat plate shape and a circumferential surface. The antenna may further include a plurality of grooves defined by the circumferential surface.

The antenna support ring may include a plurality of protrusions along a circumference of the antenna support ring. The plurality of protrusions may include a size that is smaller than a size of the plurality of grooves of the antenna. The plurality of protrusions each define a coupling hole. The main part may further include a plurality of coupling bolts inserted through the coupling holes and the plurality of protrusions, each coupling bolt coupled to the protrusions and configured to fix the antenna to the upper plate.

Each protrusion may be within each groove. A space may be provided between each protrusion in each groove, based on the size of the protrusions being smaller than the size of the grooves.

The antenna may include a plurality of slots including a variety of shapes, the plurality of slots defined by at least one inner surface of the antenna.

The main part of the plasma apparatus may further include at least one metal gasket adhered to the antenna support ring. The metal gasket may be configured to maintain electrical contact between the antenna and the antenna support ring.

Example embodiments relate to an antenna for a plasma processing apparatus, including a flat plate shape and a plurality of grooves defined by a circumferential surface of the antenna. The plurality of grooves may be distributed along a circumference of the antenna.

The antenna may further include a plurality of slots including a variety of shapes. The plurality of slots may be defined by at least one inner surface of the antenna.

The plurality of grooves may include a u-shape.

BRIEF DESCRIPTION OF THE DRAWINGS

The foregoing and other features and advantages will be apparent and be more readily appreciated from the more particular description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
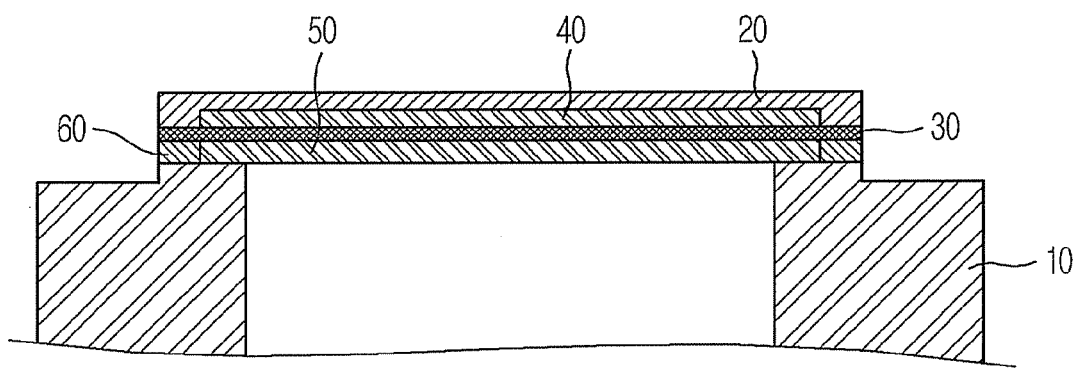
FIG. 1 is a sectional view schematically illustrating a microwave plasma processing apparatus according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an", and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view schematically illustrating a microwave plasma processing apparatus 1 according to example embodiments.

As shown in FIGS. 1 to 4, a microwave plasma processing apparatus 1 includes: a chamber 10 in which plasma processing is performed; an upper plate 20 provided on the top of the chamber 10; an antenna 30 provided under the upper plate 20 to generate plasma in the chamber 10; an upper insulator 40 provided between the upper plate 20 and the antenna 30 to cover the top of the antenna 30; a lower insulator 50 provided under the antenna 30 to cover the bottom of the antenna 30; an antenna support ring 60 provided under the antenna 30 to fix the antenna 30 to the upper plate 20; and a gasket 70 adhered to the antenna support ring 60. The gasket 70 may be a metal, but example embodiments are not limited thereto. Further, while FIGS. 1 to 4 discuss a microwave plasma processing apparatus, example embodiments may also relate to plasma processing apparatuses that generate frequencies at frequencies outside the microwave range. Plasma processing apparatuses according to example embodiments may be used to deposit thin films, such as insulating films, and/or to remove thin films by an etching and/or ashing process, but example embodiments are not limited thereto.

As shown in FIG. 1, the microwave plasma processing apparatus 1 is provided with a chamber 10 in which plasma processing is performed.

Figure 5:
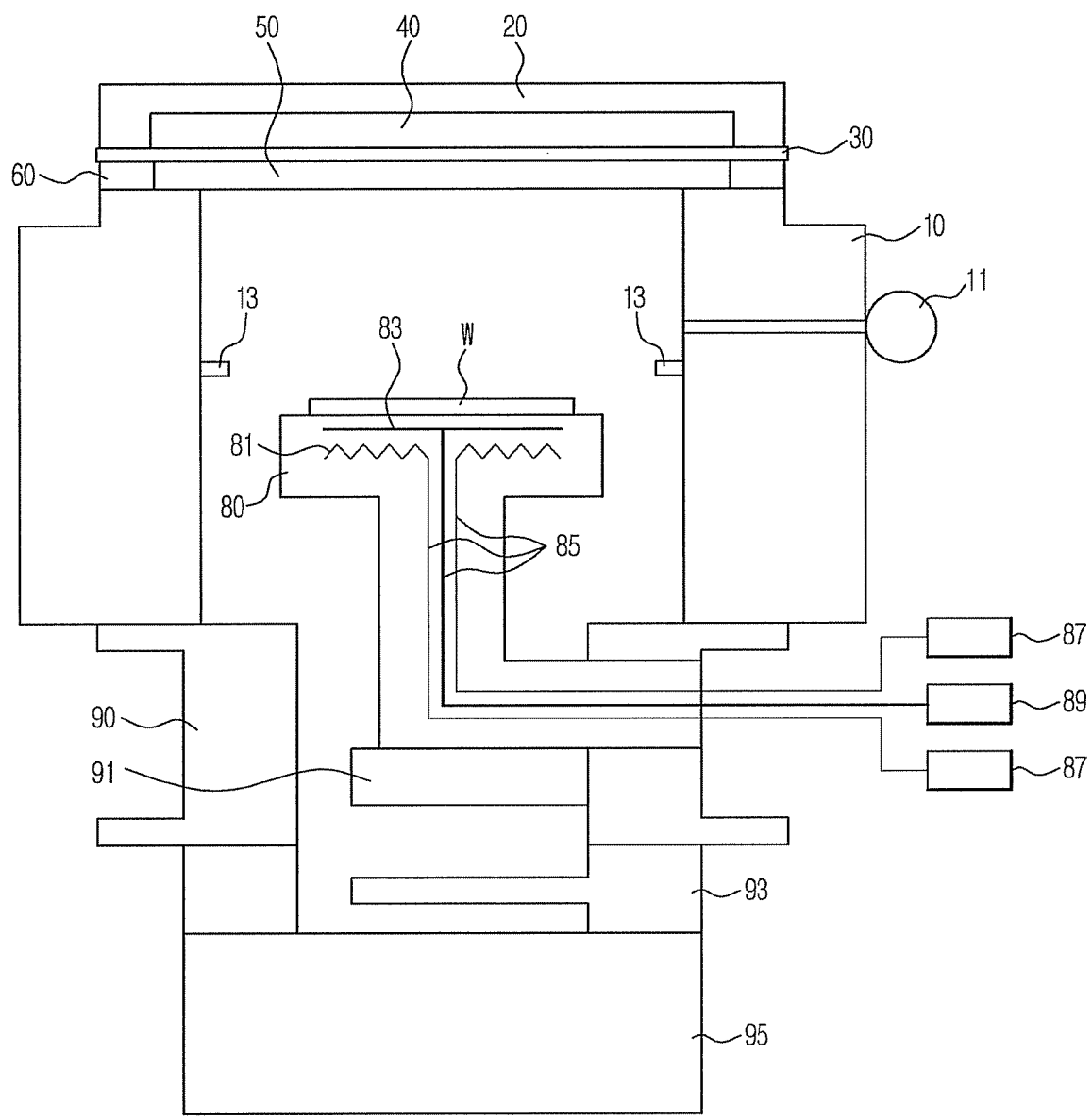
FIG. 5 is a sectional view schematically illustrating a microwave plasma processing apparatus according to example embodiments.

In the chamber 10, electric current is transmitted along the surface of the antenna 30 and a gas which passes through the lower insulator 50 provided under the antenna 30 and is supplied thereto is converted into plasma to form an insulating film on a semiconductor wafer W (the wafer W is not shown in FIG. 1, but refer to FIGS. 5 and/or 6).

As shown in FIG. 1, the upper plate 20 is provided on the chamber 10 and may serve as a cooling plate.

The upper plate 20 may be provided with a channel (not shown in FIG. 1, but refer to FIG. 4 for an illustration of the channel C) through which cooling water flows.

The antenna 30 may be made of a conductor. The antenna 30 may be provided under the upper plate 20 and the antenna 30 may generate plasma in the chamber 10.

The antenna 30 may be a flat plate antenna to produce plasma at a uniform (or substantially uniform) density over a large area, but example embodiments are not limited thereto and the antenna may be other shapes.

Figure 2:
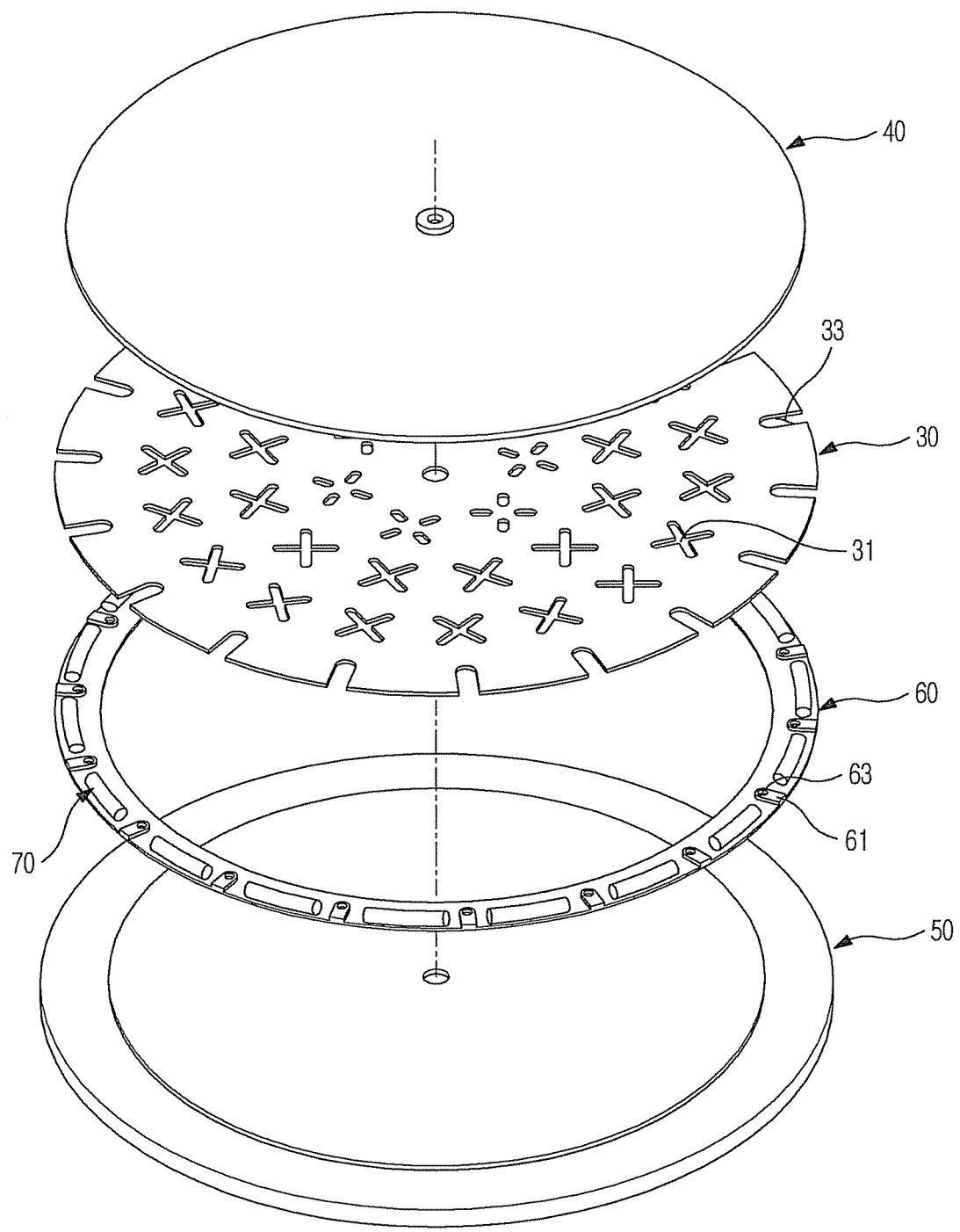
FIG. 2 is an exploded perspective view illustrating component parts of a microwave plasma processing apparatus according to example embodiments.

As shown in FIG. 2, the lower insulator 50, the antenna support ring 60, the antenna 30, and the upper insulator 40 may have a circular and/or flat plate shapes, but example embodiments are not limited thereto. The lower insulator 50, the antenna support ring 60, the antenna 30, and the upper insulator 40 may be sequentially stacked. The antenna 30 includes a plurality of slots 31 which may have a variety of shapes, the slots 31 defined by inner surfaces of the antenna 30.

Microwaves are irradiated into the chamber 10 through the slots 31 provided in the antenna 30.

In order to irradiate microwaves into the chamber 10, electric current is transmitted to the antenna 30, causing the antenna 30 to be heated.

The antenna 30 may heat up due to the resistance of the conductor when power is applied to the antenna 30.

Figure 3:
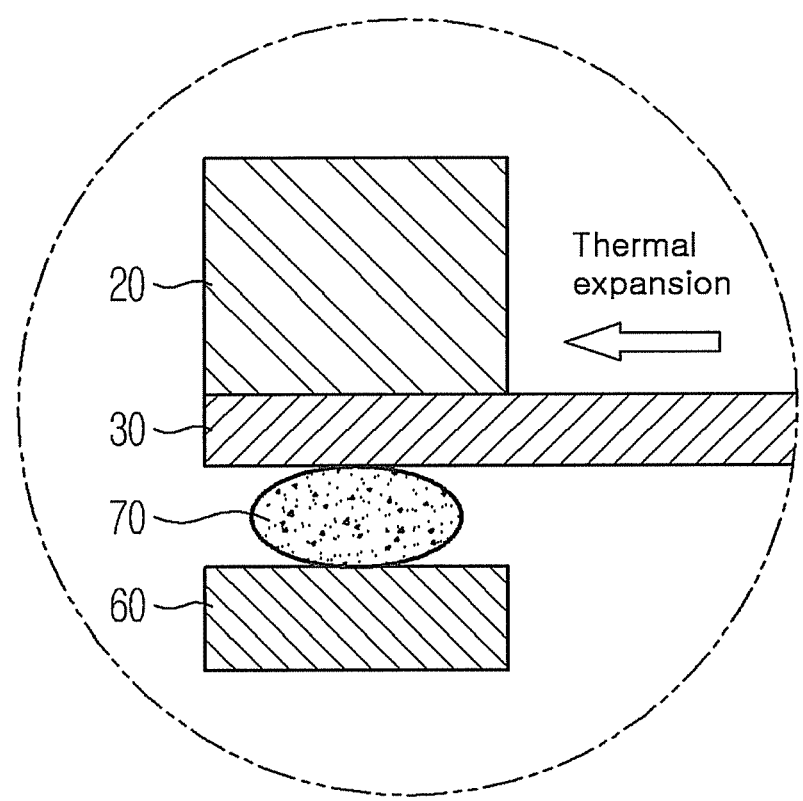
FIG. 3 is a sectional view illustrating the connection of main parts of a microwave plasma processing apparatus according to example embodiments.

The antenna 30 can expand due to thermal expansion effects when the antenna 30 is heated. In particular, the antenna 30 including a circular shape may be thermally expanded and thus lengthened in a radial direction as represented by an arrow, when heated to several hundred degrees, as shown in FIG. 3.

When heated, the antenna 30 is not lengthened in the radial direction due to the clamped bolt and instead swells upward, since it passes through the bolt and thus comes in contact with the upper plate 20.

For this reason, the antenna 30 is deformed, for example, distorted, over time, having an effect on the process, and in serious cases, causing the slots 31 of the antenna 30 to be arced.

In order to reduce thermal expansion of the antenna 30 in the radial direction caused by heating, the antenna 30 may be provided with a plurality of long grooves 33 along the circumferential surface thereof, as shown in FIG. 2.

Figure 4:
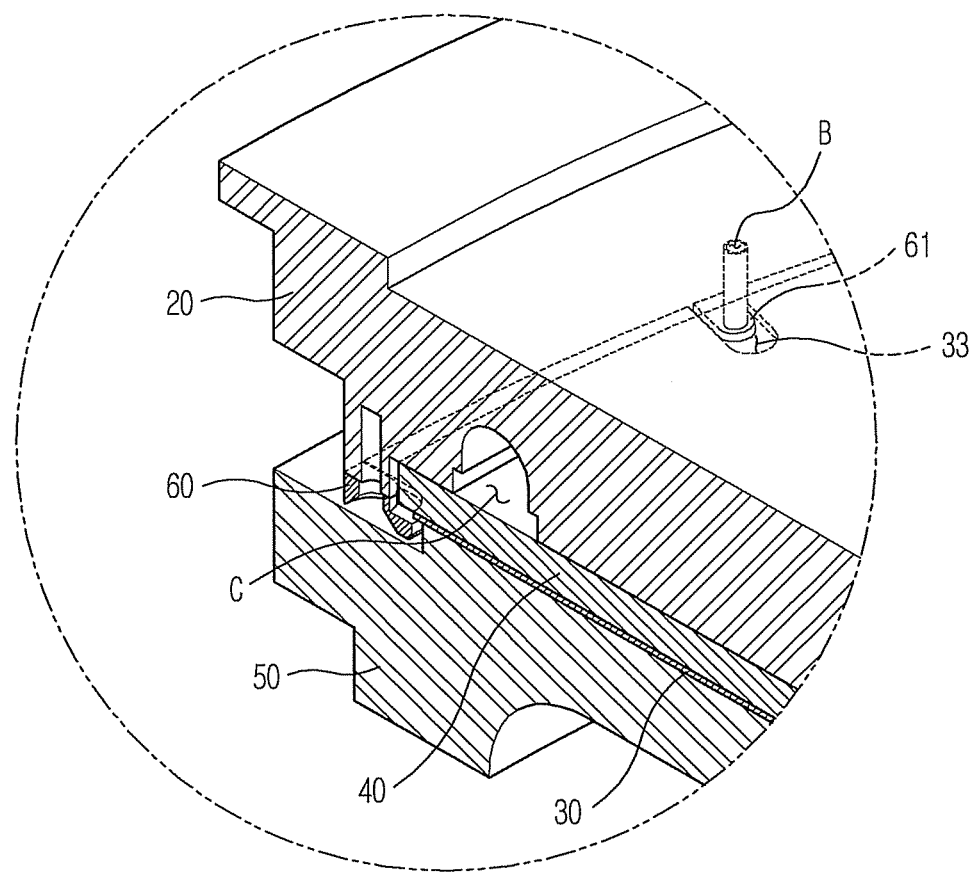
FIG. 4 is a perspective view illustrating a main part of a microwave plasma processing apparatus according to example embodiments.

Referring to FIGS. 2 and 4, a protrusion 61 formed along the circumferential surface of an antenna support ring 60 may be inserted into and coupled to the long groove 33 formed along the circumferential surface of the antenna 30.

The protrusion 61 formed along the circumferential surface of the antenna support ring 60 is provided with a coupling hole 63.

A bolt B, as shown in FIG. 4, may be inserted through the coupling hole 63 formed on the antenna support ring 60 and through the long groove 33 to fix the antenna 30 to the upper plate 20.

As shown in FIG. 4, the long groove 33 formed along the circumferential surface of the antenna 30 is larger than the protrusion 61 formed along the circumferential surface of the antenna support ring 60, thus providing a space between the long groove 33 and the protrusion 61.

The space enables the antenna 30 to expand in a radial direction, when heated, and minimizes the effect of the bolt on the antenna 30 expanding in a radial direction.

Accordingly, in a case where the antenna 30 undergoes thermal expansion in a radial direction, the antenna 30 may expand more freely in a radial direction without being deformed. Further, the impact on the process from the antenna 30 being distorted may be reduced, and the antenna 30 may maintain contact with the upper plate 20.

As shown in FIGS. 1, 2, and 4, upper and lower insulators 40 and 50 are provided over and below the antenna 30, respectively.

The upper insulator 40 is provided between the upper plate 20 and the antenna 30. The upper insulator 40 covers the top of the antenna 30, and the upper insulator 40 insulates the antenna 30 from coming into contact with the upper plate 20. Cooling water may flow in the upper plate 20, and the cooling water can minimize the antenna 30 from being heated.

The lower insulator 50 is provided under the antenna 30 and covers the bottom of the antenna 30. The lower insulator 50 insulates the antenna 30. The lower insulator 50 may have a dome structure that can withstand vacuum, but example embodiments are not limited thereto.

As shown in FIGS. 1 to 4, the antenna support ring 60 is provided under the antenna 30, to fix the antenna 30 to the upper plate 20.

As mentioned above, the antenna support ring 60 is provided with the protrusions 61 along the circumferential surface thereof, and the protrusions 61 are provided with coupling holes 63, through which bolts B may be coupled to the protrusion 61.

The protrusion 61 may be formed along the circumferential surface of the antenna support ring 60 and inserted into and coupled to a long groove 33 of the antenna 30. A long groove 33 of the antenna may be formed along a circumferential surface of the antenna 30. A bolt B may be coupled through the long groove 33 and the coupling hole 63 provided in the protrusion 61 to fix the antenna 30 to the upper plate 20.

As shown in FIGS. 2 and 3, a plurality of metal gaskets 70 serving as springs may be adhered to the antenna support ring 60.

The metal gaskets 70 adhered to the top of the antenna support ring 60 push the antenna 30 up, like a spring, to maintain contact between the antenna 30 and the upper plate 20 by a desired (or alternatively predetermined) force.

When the antenna 30 heats up when power is applied, the antenna 30 can slide, but a friction force of the metal gasket 70, serving as a spring, and is naturally expanded in the radial direction and maintains contact between the antenna 30 and the upper plate 20.

Similar to that the space is formed between the long groove 33 formed along the circumferential surface of the antenna 30 and the protrusion 61 formed along the circumferential surface of the antenna support ring 60 to allow the antenna 30 to be lengthened in the radial direction by thermal expansion, the surrounding structure and the outer diameter of the antenna 30 may be spaced by a desired (or alternatively a predetermined) distance or more.

In addition, the metal gasket 70 maintains electrical contact between the antenna 30 and the antenna support ring 60.

Referring to FIG. 5, a microwave plasma processing apparatus 1 may be configured to receive a semiconductor wafer W (or substrate). The wafer W may be loaded in the chamber 10 to be plasma processed. The wafer may be fixed on the susceptor 80. The chamber 10 includes a gauge 11 (or alternatively a pressure sensor such as a manometer and/or pressure transducer, and the like) to measure an internal pressure of the chamber 10 when the semiconductor wafer W is plasma-processed and/or when the chamber 10 does not include a wafer W loaded therein. The microwave plasma processing apparatus 1 may include at least one gas nozzle 13 through which a gas is supplied to the chamber 10. While FIG. 5 discusses a microwave plasma processing apparatus, example embodiments are not limited thereto and may include a plasma processing apparatus that generates plasmas at other frequencies besides the microwave frequency range.

A support 91 to support the susceptor 80, and a fixing unit 90, on which the support 91 is fixed, are arranged under the susceptor 80.

A pressure control valve 93 may be arranged under the fixing unit 90, to automatically control and/or maintain the pressure in the chamber 10. The pressure in the chamber 10 may be measured by the gauge 11 provided in the chamber 10. A turbo pump 95 may be arranged under the pressure control valve 93. The turbo pump may 95 remove gas from the chamber 10, for example gas supplied supplied through the gas nozzle 13 provided in the chamber 10.

The susceptor 80 may be provided with a heater 81 to heat the semiconductor wafer W in order to improve properties of the semiconductor wafer W during the plasma processing of the semiconductor wafer W, and an electrode 83 to apply radio frequency (RF) bias to the semiconductor wafer W.

Although FIG. 5 illustrates a configuration in which both the heater 81 and the electrode 83 are provided, example embodiments are not limited thereto. Either the heater 81 or electrode 83 may be provided separately and/or omitted without limitation.

The heater 81 and the electrode 83 provided in the susceptor 80 may be connected through an inner conductor 85 to an outer alternating current supply module 87 or RF module 89.

The heater 81 receives alternating current from the alternating current supply module 87 connected through the conductor 85 and heats the semiconductor wafer W. The alternating current supply module 87 to supply alternating current to the heater 81 may be divided into two sections to separately control two regions of the susceptor 80.

The electrode 83 receives an RF bias from the RF module 89 connected through the conductor 85 and applies the RF bias to the semiconductor wafer W. The RF module 89 is configured to apply an RF bias to the electrode 83. The RF module includes an RF generator (not shown), an RF cable (not shown) and an RF matching network (not shown) to transfer RF power.

When the electrode 83 applies RF bias to the semiconductor wafer W, RF noise or leaked current may be transferred to the heater 81 due to an inner structure of the susceptor 80. In order to prevent this phenemenon, the RF module 89 may include an RF filter (not shown).

Figure 6:
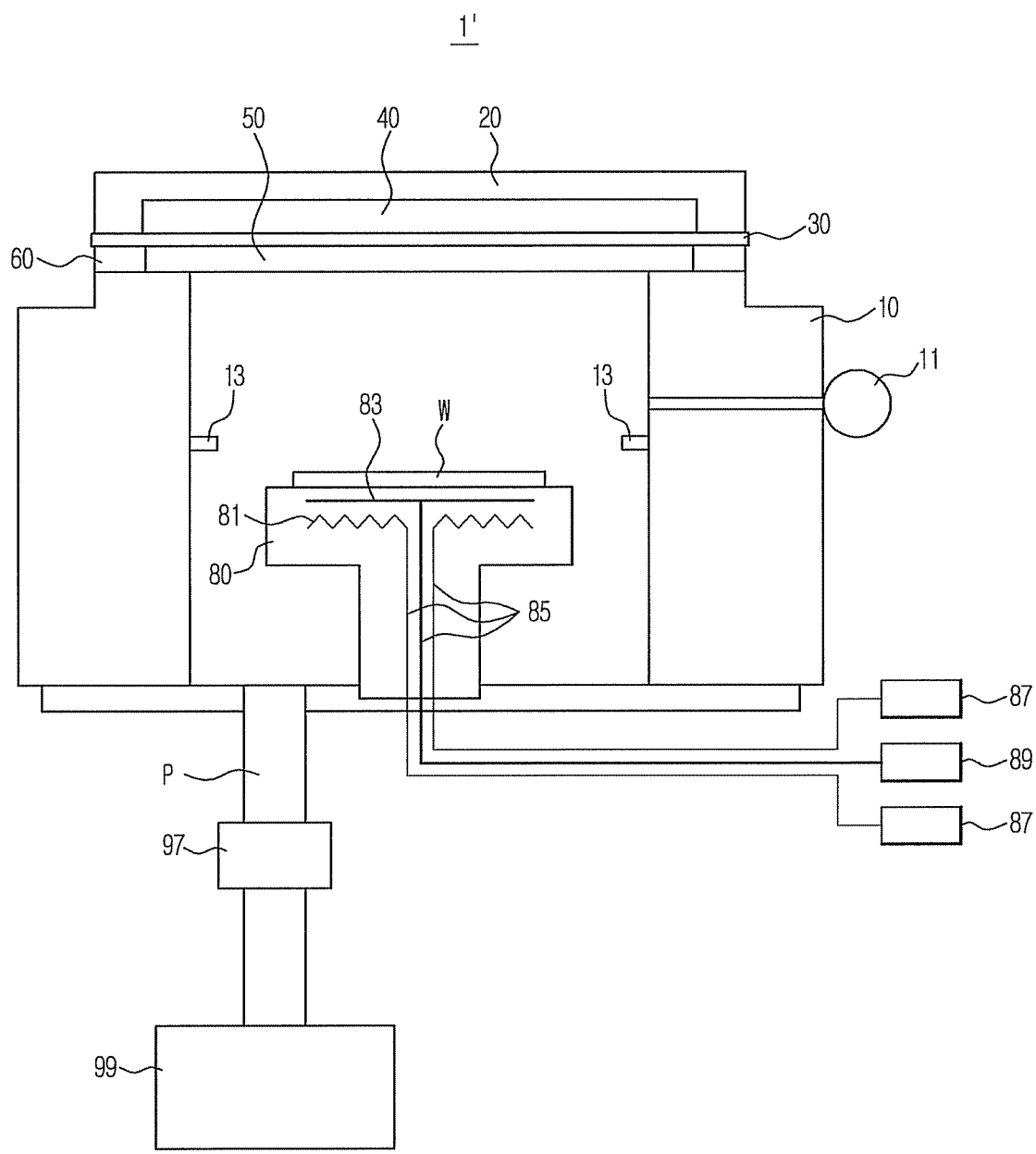
FIG. 6 is a schematic view illustrating a microwave plasma processing apparatus according to example embodiments.

FIG. 6 illustrates another a microwave plasma processing apparatus 1', according to example embodiments, in which a gas present in a chamber of a microwave plasma processing apparatus 1' may be discharged.

As shown in FIG. 6, the microwave plasma processing apparatus 1' is designed such that an internal pressure thereof is controlled using a throttle valve 97 connected to a dry pump 99 through the discharge pipe P and at the same time, the inner gas of the chamber 10 is discharged through a discharge pipe P.

As apparent from the foregoing, in accordance with example embodiments, the antenna 30 can more freely expand through the long groove formed 33 along the circumferential surface of the antenna 30 and the protrusion 61 formed along the circumferential surface of the antenna support ring 60.

In addition, the antenna can maintain electrical contact through the metal gasket 70 when the antenna 30 is thermally expanded.

In addition, based on the aforementioned configuration, close contact between the antenna 30, and upper 40 and lower insulators 50 can be realized, more stable plasma processing can be maintained and a stable plasma state can be obtained.

Although example embodiments have been particularly shown and described, it will be appreciated by those skilled in the art that variations in form and detail may be made therein without departing from the spirit and scope of the claims and their equivalents.

What is claimed is:

1. A plasma processing apparatus comprising:
a chamber configured to perform a plasma process;
an upper plate on the chamber;
an antenna under the upper plate, the antenna configured to generate plasma in the chamber and including a plurality of grooves defined by a circumferential surface of the antenna;
an upper insulator between the upper plate and the antenna, the upper insulator covering a top of the antenna;
a lower insulator covering a bottom of the antenna;
an antenna support ring disposed below the antenna and configured to fix the antenna to the upper plate, the antenna support ring including a plurality of protrusions along a circumferential surface of the antenna support ring;
and a metal gasket adhered to the antenna support ring,
wherein the plurality of grooves are configured to correspond to and accommodate the plurality of protrusions,
the antenna further including a plurality of slots through which microwaves are irradiated into the chamber.

2. The plasma processing apparatus according to claim 1, wherein the antenna includes a flat plate antenna.

3. The plasma processing apparatus according to claim 2, wherein
the plurality of slots includes a variety of shapes, the plurality of slots defined by at least one inner surface of the antenna.

4. The plasma processing apparatus according to claim 1, wherein
the plurality of slots includes a variety of shapes, the plurality of slots defined by at least one inner surface of the antenna.

5. The plasma processing apparatus according to claim 1, wherein the metal gasket is configured to push the antenna up to maintain contact between the antenna and the upper plate.

6. The plasma processing apparatus according to claim 1, wherein the metal gasket is configured to maintain electrical contact between the antenna and the antenna support ring.

7. The plasma processing apparatus according to claim 1, wherein the chamber includes a susceptor,
the susceptor is configured to support a semiconductor wafer, and
the susceptor is connected to at least one of a heater and an electrode, the electrode configured to apply RF bias.

8. A main part for a plasma processing apparatus comprising:
a chamber;
an antenna support ring disposed on the chamber, the antenna support ring including a plurality of protrusions along a circumferential surface of the antenna support ring;
an antenna on the antenna support ring, the antenna configured to generate a plasma in the chamber and including a plurality of grooves defined by a circumferential surface of the antenna;
an insulator covering the antenna; and an upper plate on the insulator, the upper plate fixed to the antenna by the antenna support ring, wherein the plurality of grooves are configured to correspond to and accommodate the plurality of protrusions, the antenna further including a plurality of slots through which microwaves are irradiated into the chamber.

9. The main part of claim 8, wherein the antenna includes a flat plate shape.

10. The main part of claim 9, wherein the plurality of protrusions include a size that is smaller than a size of the plurality of grooves of the antenna, the plurality of protrusions each define a coupling hole; and the main part further includes a plurality of coupling bolts inserted through the coupling holes and the plurality of protrusions, each coupling bolt coupled to the protrusions and configured to fix the antenna to the upper plate.

11. The main part of claim 10, wherein each protrusion is within each groove, and a space is provided between each protrusion in each groove, based on the size of the protrusions being smaller than the size of the grooves.

12. The main part of claim 8, wherein the plurality of slots includes a variety of shapes, the plurality of slots defined by at least one inner surface of the antenna.

13. The main part of claim 8, further comprising:

at least one metal gasket adhered to the antenna support ring, the metal gasket configured to maintain electrical contact between the antenna and the antenna support ring.

14. An antenna for a plasma processing apparatus, comprising:

a flat plate shape; and a plurality of grooves defined by a circumferential surface of the antenna, the plurality of grooves distributed along a circumference of the antenna, wherein the plurality of grooves are configured to correspond to and accommodate a plurality of protrusions adhered to an antenna support ring that are inserted into and coupled with the plurality of grooves, the antenna further including a plurality of slots through which microwaves are irradiated into a plasma chamber.

15. The antenna of claim 14, wherein, the plurality of slots including a variety of shapes, the plurality of slots defined by at least one inner surface of the antenna.

16. The antenna of claim 14, wherein the plurality of grooves include a u-shape.

* * * * *